US010884392B2

(12) United States Patent
Sanders et al.

(10) Patent No.: US 10,884,392 B2
(45) Date of Patent: Jan. 5, 2021

(54) ASSESSING DEFLECTIONS EXPERIENCED BY A WORKPIECE DURING COMPUTER CONTROLLED MACHINING WITH A TOOLPATH TO DETERMINE STOCK AMOUNT

(71) Applicant: Autodesk, Inc., San Rafael, CA (US)

(72) Inventors: Lee Sanders, Tamworth (GB); Daniel Mario Noviello, London (GB)

(73) Assignee: Autodesk, Inc., San Rafael, CA (US)

(\*) Notice: Subject to any disclaimer, the term of this patent is extended or adjusted under 35 U.S.C. 154(b) by 58 days.

(21) Appl. No.: 16/111,006

(22) Filed: Aug. 23, 2018

(65) Prior Publication Data

US 2020/0064809 A1   Feb. 27, 2020

(51) Int. Cl.
  *G05B 19/404* (2006.01)
  *G05B 19/4093* (2006.01)
  (Continued)

(52) U.S. Cl.
  CPC ........... *G05B 19/404* (2013.01); *B23Q 15/18* (2013.01); *B23Q 15/22* (2013.01);
  (Continued)

(58) Field of Classification Search
  None
  See application file for complete search history.

(56) References Cited

U.S. PATENT DOCUMENTS 3,641,872 A   2/1972   Ulfhielm
4,445,182 A   4/1984   Morita et al.
(Continued)

FOREIGN PATENT DOCUMENTS

DE   196 07 192 A1   1/1997
DE   10 2010 033 732 A1   2/2012
(Continued)

OTHER PUBLICATIONS

Popma, "Computer aided process planning for high-speed milling of thin-walled parts", 2010, University of Twente, Enschede, the Netherlands, pp. 15-16, 59 (Year: 2010).*
(Continued)

*Primary Examiner* — Mohammad Ali
*Assistant Examiner* — David Earl Ogg
(74) *Attorney, Agent, or Firm* — Fish & Richardson P.C.

(57) ABSTRACT

Methods, systems, and apparatus, including medium-encoded computer program products, for computer aided design and manufacture of physical structures using subtractive manufacturing systems and techniques and a determined stock allowance include, in one aspect, a method including: obtaining a finishing toolpath specification for three dimensional (3D) geometry of a part; generating 3D geometry of a model of a semi-finished structure in accordance with a computer simulation of deflections experienced by a workpiece as stock material is cut from the workpiece using the finishing toolpath specification; creating a semi-finishing toolpath specification for the semi-finished structure; and providing the semi-finishing toolpath specification for use in machining the part by cutting away a first portion of the stock material using the semi-finishing toolpath specification to form the semi-finished structure, followed by performing a finishing operation of the semi-finished structure by cutting away a second portion of the stock material to form the part.

21 Claims, 5 Drawing Sheets

(51) Int. Cl.
  B23Q 15/22    (2006.01)
  B23Q 15/18    (2006.01)
  G06F 30/17    (2020.01)
  G06F 30/20    (2020.01)
(52) U.S. Cl.
  CPC ....... G05B 19/40931 (2013.01); G06F 30/17 (2020.01); G06F 30/20 (2020.01)

(56) References Cited

U.S. PATENT DOCUMENTS

| | | | |
|---|---|---|---|
| 4,510,427 | A | 4/1985 | Nozawa et al. |
| 5,055,752 | A | 10/1991 | Leistensnider et al. |
| 5,954,464 | A | 9/1999 | Dansereau et al. |
| 6,077,002 | A | 6/2000 | Lowe |
| 6,491,482 | B1 | 12/2002 | Fenkl et al. |
| 6,676,344 | B1 | 1/2004 | Amatt |
| 9,776,255 | B2 | 10/2017 | Caldicott |
| 2012/0215352 | A1* | 8/2012 | Eberst .................. B25J 9/1664 700/253 |
| 2013/0024021 | A1 | 1/2013 | Atabey |
| 2014/0088746 | A1 | 3/2014 | Maloney et al. |
| 2017/0095865 | A1* | 4/2017 | Caldicott ........... G05B 19/4099 |
| 2017/0368614 | A1 | 12/2017 | Caldicott |

FOREIGN PATENT DOCUMENTS

| | | |
|---|---|---|
| EP | 1 195 226 A1 | 4/2002 |
| GB | 2 385 815 B | 1/2005 |

OTHER PUBLICATIONS

Masmali, "An analytical approach for machining thin-walled workpieces", 2017, Procedia CIRP 58, pp. 187-192 (Year: 2017).*

Chen et al., "Deformation prediction and error compensation in multilayer milling processes for thin-walled parts," International Journal of Machine Tools & Manufacture (2009) 49:859-864.

Choi et al., "Sculptured surface machining: theory and applications", Springer Science Business Media, B.V., 1998, 10 pages.

Del Pozo et al., "Prediction of press/die deformation for an accurate manufacturing of drawing dies," Int. J. Adv. Manuf. Technol. (2008) 37:649-656.

Ding et al., "Flow line machining of turbine blades," Proceedings of the 2004 International Conference on Intelligent Mechatronics and Automation, Chengdu, China, 2004, pp. 140-145.

Dugas et al., "An enhanced machining simulator with tool deflection error analysis," Journal of Manufacturing Systems (2002) 21(6):451-463.

Johns et al., "A new compensating toolpath approach for clamping forces in freeform pocket machining," Proceedings of the 2012 Industrial and System Engineering Research Conference, Abstract ID: 47, 7 pages.

Pena et al., "Research concerning optimum cutting parameters according with tool path strategy for finishing procedures," IOP Conf. Series: Materials Science and Engineering (2015) 95:012020.

Ratchev et al., "Error compensation strategy in milling flexible thin-wall parts," Journal of Materials Processing Technology (2005) 162-163:673-681.

Ratchev et al., "Force and deflection modelling in milling of low-rigidity complex parts," Journal of Materials Processing Technology (2003) 143-144:796-801.

Ratchev et al., "Towards deflection prediction and compensation in machining of low-rigidity parts," Proceedings of the Institution of Mechanical Engineers (2002) 216(B):129-134.

Zhang et al., "An adaptive approach to error compensation by on-machine measurement for precision machining of thin-walled blade," 2015 IEEE International Conference on Advanced Intelligent Mechatronics (AIM), Jul. 7-11, 2015, Busan, Korea, 5 pages.

Zoran et al., "The hybrid artisans: a case study in smart tools," ACM Transactions on Computer-Human Interaction (2014) 21(3):1-29.

Unknown author, "Computer-aided manufacturing—Wikipedia, the free encyclopedia," (Sep. 29, 2015) [online] (retrieved from https://en.wikipedia.org/wiki/Computer-aided_manufacturing), 6 pages.

Unknown author, "Feeds and speeds tutorial for CNC," © 2012 by CNCCookbook, Inc., 79 pages.

Unknown author, Plastics Today, "High-feed function cuts machining time," Aug. 22, 2008, 2 pages.

Unknown author, Machinery's Handbook, New York, The Industrial Press, The Machinery Publishing Company, Ltd., 1915, 8 pages.

Unknown author, Concepts ETI, Inc., MAX-PAC User's Guide documentation, Copyright 2013 (document dated Jun. 2, 2017), 7 pages.

Unknown author, Concepts NREC, 2002 MAX-5/MAX-AB User's Guide, Version 6.3, Aug. 2002, 225 pages.

Unknown author, "CUTPRO: fundamentals of machining—start to finish guide," © 2013 Manufacturing Automation Laboratories Inc., available at https://www.malinc.com/wp-content/uploads/2014/05/CutPro_Guide.pdf, 88 pages.

Unknown author, "Machining—Wikipedia" (May 9, 2018) [online] (retrieved from https://en.wikipedia.org/wiki/Machining), 8 pages.

* cited by examiner

ASSESSING DEFLECTIONS EXPERIENCED BY A WORKPIECE DURING COMPUTER CONTROLLED MACHINING WITH A TOOLPATH TO DETERMINE STOCK AMOUNT

BACKGROUND

This specification relates to computer aided design and manufacture of physical structures using subtractive manufacturing systems and techniques.

Computer Aided Design (CAD) software and Computer Aided Manufacturing (CAM) software has been developed and used to generate three-dimensional (3D) representations of parts and to manufacture the physical structures of those parts, e.g., using Computer Numerical Control (CNC) manufacturing techniques. Further, additive manufacturing, also known as solid free form fabrication or 3D printing, refers to any manufacturing process where 3D parts are built up from raw material (generally powders, liquids, suspensions, or molten solids) in a series of two-dimensional layers or cross-sections. An example of additive manufacturing is Fused Filament Fabrication (FFF). A 3D extrusion printer typically uses FFF to lay down material, such as a plastic filament or metal wire, which is unwound from a coil, in layers to produce a 3D printed part.

In addition, subtractive manufacturing refers to any manufacturing process where 3D parts are created from stock material (generally a "blank" or "workpiece" that is larger than the 3D part) by cutting away portions of the stock material. Such manufacturing processes typically involve the use of multiple CNC machine cutting tools in a series of operations, starting with a roughing operation, an optional semi-finishing operation, and a finishing operation. During roughing operation(s), large portions of the workpiece are cut away quickly (relative to semi-finishing and finishing operations) using cutting tool(s) of the CNC machining system in order to approximate the final shape of the part being manufactured. Moreover, when CNC finishing machining operations are to be performed on tall thin structures, the amount of rough and semi-finish stock left on the structure before the finishing is left up to the individual programming the CNC machine for the particular part. Thus, the amount of stock can readily vary from being excessive (causing unnecessary wear on the CNC tooling) to being inadequate (potentially causing failure of the finishing), and this stock amount variation can result in undesirable impacts on surface finish and accuracy of the component being manufactured.

SUMMARY

This specification describes technologies relating to computer aided design and manufacture of physical structures using subtractive manufacturing systems and techniques and a stock allowance determined by assessing deflections experienced by a workpiece during computer controlled machining.

In general, one or more aspects of the subject matter described in this specification can be embodied in one or more methods that include: obtaining, in a computer-aided design or manufacturing program, a finishing toolpath specification for three dimensional geometry of a part to be machined by a computer-controlled manufacturing system from a workpiece; generating three dimensional geometry of a model of a semi-finished structure in accordance with a computer simulation of deflections experienced by the workpiece as stock material is cut from the workpiece by the computer-controlled manufacturing system using the finishing toolpath specification to form the part from the workpiece; creating a semi-finishing toolpath specification for the three dimensional geometry of the model of the semi-finished structure; and providing the semi-finishing toolpath specification for use in machining the part by the computer-controlled manufacturing system by cutting away a first portion of the stock material using the semi-finishing toolpath specification to form the semi-finished structure from the workpiece, followed by performing a finishing operation of the semi-finished structure by cutting away a second portion of the stock material to form the part from the workpiece.

Obtaining the finishing toolpath specification can include creating the finishing toolpath specification based on a three dimensional model of the part and user input regarding one or more cutting conditions. The computer-implemented method can include modifying the finishing toolpath specification based on the created semi-finishing toolpath specification, wherein the finishing operation uses the modified finishing toolpath specification. The computer-implemented method can include: generating three dimensional geometry of a model of a roughed structure in accordance with a computer simulation of deflections experienced by the workpiece as stock material is cut from the workpiece by the computer-controlled manufacturing system using the semi-finishing toolpath specification; creating a roughing toolpath specification for the three dimensional geometry of the model of the roughed structure; and providing the roughing toolpath specification for use in machining the part by the computer-controlled manufacturing system by cutting away a third portion of the stock material using the roughing toolpath specification to form the roughed structure from the workpiece before performing the semi-finishing operation on the roughed structure.

The computer-implemented method can include: obtaining (i) a computer model of the three dimensional geometry of the part, (ii) first information regarding material properties of the workpiece, (iii) second information regarding one or more cutting tools to be used by the computer-controlled manufacturing system, and (iv) cutting conditions of the finishing toolpath specification, wherein the cutting conditions include a maximum depth of cut; and performing the computer simulation of tooling forces experienced by the workpiece as stock material is cut from the workpiece by the computer-controlled manufacturing system using the finishing toolpath specification and various depths of cut that are equal to or less than the maximum depth of cut. Performing the computer simulation can include: calculating multiple three dimensional models of the semi-finished structure, wherein each of the multiple three dimensional models has a different stock allowance; simulating machining of the part from each of the multiple three dimensional models using the one or more cutting tools of the computer-controlled manufacturing system; and selecting one of the multiple three dimensional models having a best response to the deflection forces calculated during the simulating.

Performing the computer simulation can include: selecting an initial semi-finished stock amount to indicate a first one of the multiple three dimensional models; performing numerical toolpath simulation using finite element analysis to simulate the machining of the part; assessing the deflections experienced by the workpiece in accordance with the finite element analysis of the numerical toolpath simulation; incrementally adding or removing semi-finished stock amount, based on the assessed deflections, to indicate a next one of the multiple three dimensional models; and repeating the performing the numerical toolpath simulation, the assessing the deflections, and the incrementally adding or removing the semi-finished stock amount to optimize the semi-finished stock amount. The computer-implemented method can include receiving input specifying a machining preference among (i) manufacturing speed, (ii) surface finish quality, (iii) maximizing tool life, and (iv) minimizing vibration, wherein the calculating, simulating and selecting is performed in accordance with the machining preference.

Calculating the multiple three dimensional models can include calculating, for each model, a stock allowance that varies continuously along a length of the part. Moreover, the computer-controlled manufacturing system can include one or more computer processing apparatus including at least one non-transitory computer-readable medium encoding the computer aided design or manufacturing program. Further, the above one or more methods can be implemented using a non-transitory computer-readable medium encoding instructions operable to cause data processing apparatus to perform operations of the one or more methods, as detailed above and herein.

Likewise, one or more aspects of the subject matter described in this specification can be embodied in one or more systems that include: a data processing apparatus including at least one hardware processor; and a non-transitory computer-readable medium encoding instructions of a computer-aided design or manufacturing program, the instructions being configured to cause the data processing apparatus to obtain a finishing toolpath specification for three dimensional geometry of a part to be machined by a computer-controlled manufacturing system from a workpiece, generate three dimensional geometry of a model of a semi-finished structure in accordance with a computer simulation of deflections experienced by the workpiece as stock material is cut from the workpiece by the computer-controlled manufacturing system using the finishing toolpath specification to form the part from the workpiece, create a semi-finishing toolpath specification for the three dimensional geometry of the model of the semi-finished structure, and provide the semi-finishing toolpath specification for use in machining the part by the computer-controlled manufacturing system by cutting away a first portion of the stock material using the semi-finishing toolpath specification to form the semi-finished structure from the workpiece, followed by performing a finishing operation of the semi-finished structure by cutting away a second portion of the stock material to form the part from the workpiece.

Thus, as will be appreciated, the non-transitory computer-readable medium can encode instructions configured to cause the data processing apparatus to perform the one or more methods, as detailed above and herein. Moreover, the system can include the computer-controlled manufacturing system.

Particular embodiments of the subject matter described in this specification can be implemented to realize one or more of the following advantages. A user of a machine tool can be assisted in determining an appropriate amount of stock allowance for a part to be manufactured using a CNC machine to cut away portions of a workpiece to form the part. By determining the appropriate amount of stock allowance for a part to be manufactured, wear on the CNC tooling can be reduced, the chances of part failure during CNC finishing can be reduced, or both. In addition, improved results can be achieved for the part that is manufactured, such as improved surface finish and accuracy/tolerance of the component being manufactured.

An optimized stock allowance can be calculated so as to withstand the predicted cutting forces induced on the workpiece during the finish machining process. By calculating the stock allowance based on the expected cutting forces, a repeatable stock allowance and stock geometry can be achieved while limiting part distortion. This can aid the downstream processing, where even small variations in the manufactured part can create problems. Using simulation of the machining process, the stock allowance can be optimized for the material of the workpiece and the milling tool(s) to be used, without requiring a specific part geometry. This can take the guess work out of determining an appropriate stock allowance for finishing operation(s) and can significantly reduce programming time and tooling cost for complicated parts, such as blisks, reducing failure rates and increasing consistency in computer controlled manufacturing.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
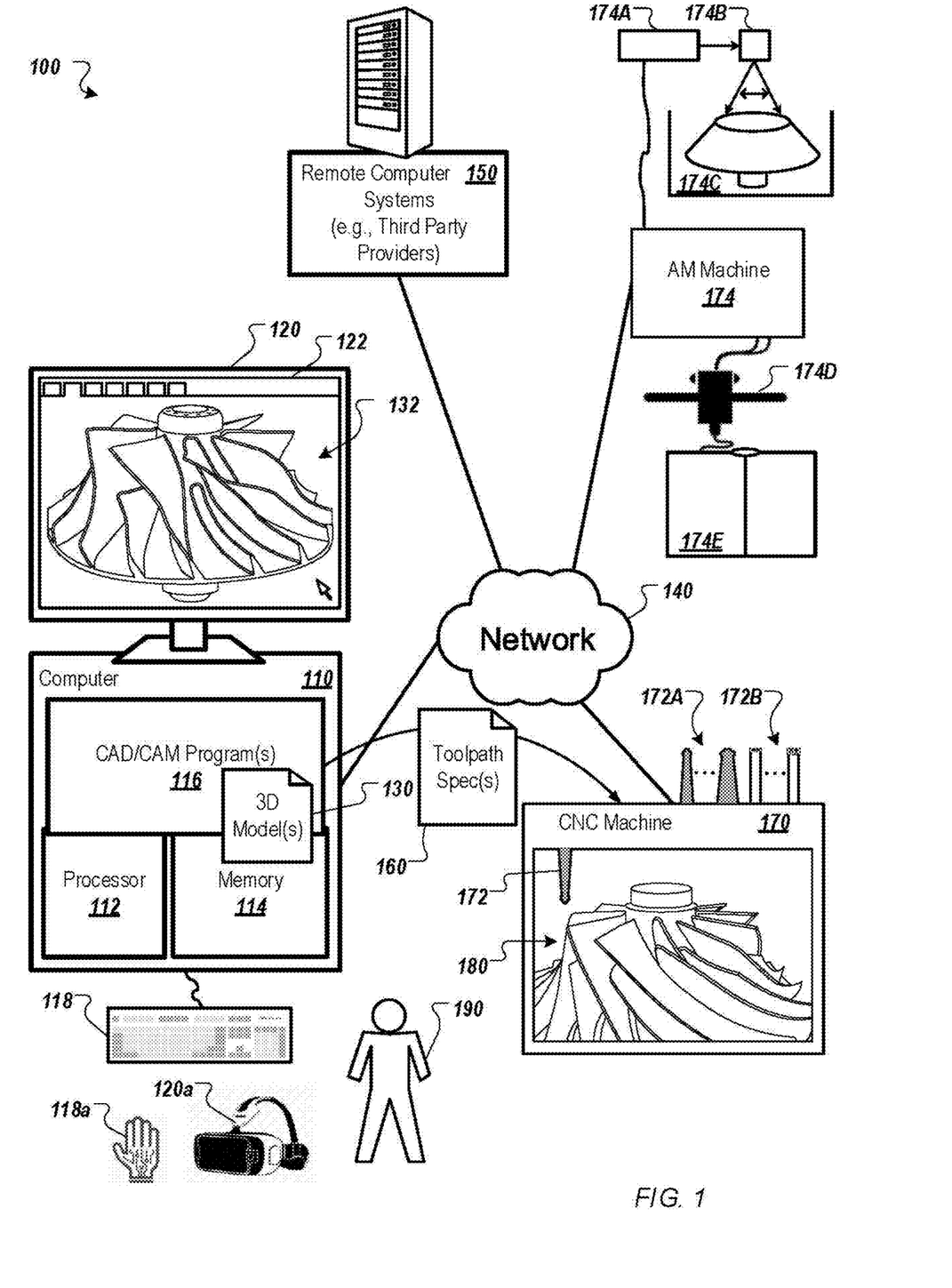
FIG. 1 shows an example of a system usable to design and manufacture physical structures.

FIG. 1 shows an example of a system 100 usable to design and manufacture physical structures. A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112.

Such programs include one or more three-dimensional (3D) modeling, simulation (finite element analysis or other) and manufacturing control programs such as Computer Aided Design (CAD) and/or Computer Aided Manufacturing (CAM) program(s) 116, also referred to as Computer Aided Engineering (CAE) programs, etc. The program(s) 116 can run locally on computer 110, remotely on a computer of one or more remote computer systems 150 (e.g., one or more third party providers' one or more server systems accessible by the computer 110 via the network 140) or both locally and remotely. The CAD/CAM program 116 presents a user interface (UI) 122 on a display device 120 of the computer 110, which can be operated using one or more input devices 118 of the computer 110 (e.g., keyboard and mouse). Note that while shown as separate devices in FIG. 1, the display device 120 and/or input devices 118 can also be integrated with each other and/or with the computer 110, such as in a tablet computer or in a virtual reality (VR) or augmented reality (AR) system. For example, the input/output devices 118, 120 can include a VR input glove 118a and a VR headset 120a.

A user 190 can interact with the program(s) 116 to create and/or load a 3D model 132 (e.g., from a document 130) of a part to be manufactured using a Computer Numerical Control (CNC) manufacturing machine 170, such as a multi-axis, multi-tool milling machine. This can be done using known graphical user interface tools, and the 3D model 132 can be defined in the computer using various known 3D modeling formats, such as using solid models (e.g., voxels) or surface models (e.g., B-Rep (Boundary Representation) and surface meshes). In addition, the user 190 can interact with the program(s) 116 to modify the 3D model 132 of the part, as needed.

In the example shown, the model 132 is a 3D model of a particular turbine wheel, but many different types of models can be used with the systems and techniques described herein. In general, the described systems and techniques are most applicable to manufacturing components that require CNC machine finishing of at least one tall thin structure, such as the blades of a blisk or turbine wheel for aerospace or power generation applications, graphite or copper rib structures, etc. Once the 3D model 132 of the part is ready to manufacture, the 3D model 132 can be prepared for manufacturing the physical structure of the part by generating toolpaths for use by the computer-controlled manufacturing system to manufacture the part. For example, the 3D model 132 can be used to generate a toolpath specification document 160, which can be sent to the CNC machine 170 and used to control operation of one or more milling tools.

This can be done upon request by the user 190, or in light of the user's request for another action, such as sending the 3D model 132 to the CNC machine 170, or other manufacturing machinery, which can be directly connected to the computer 110, or connected via a network 140, as shown. This can involve a post-process carried out on the local computer 110 or a cloud service to export the 3D model 132 to an electronic document from which to manufacture. Note that an electronic document (which for brevity will simply be referred to as a document) can be a file, but does not necessarily correspond to a file. A document may be stored in a portion of a file that holds other documents, in a single file dedicated to the document in question, or in multiple coordinated files. Further, in some implementations, the computer 110 is integrated into the CNC machine 170, and so the document 160 is created by the same computer that will use the document 160 to manufacture the part 180.

The toolpath specification document 160 (e.g., a numerical control (NC) program of an appropriate format) includes one or more finishing toolpaths that cause the CNC machine 170 to use one or more cutting tools 172 to perform finishing operation(s) to cut a physical object 180 (corresponding to the 3D model 132) from a workpiece. In some implementations, a toolpath specification document 160 can be generated that includes one or more semi-finishing toolpaths that cause the CNC machine 170 to use one or more cutting tools 172 to perform semi-finishing operation(s) to cut a semi-finished structure from a workpiece to form the workpiece on which the finishing operation(s) are performed. Moreover, in some implementations, a toolpath specification document 160 can be generated that includes one or more roughing toolpaths that cause the CNC machine 170 to use one or more cutting tools 172 to perform rouging operation(s) to cut a roughed structure from a workpiece to form the workpiece on which the semi-finishing operation(s) are performed.

As will be appreciated, there are many different types of cutting tools 172 that may be available in the CNC machine 170, including milling cutter tools with various ball nose, tapered, tip radius and barrel geometries. These different cutting tools 172 can include solid tools having different diameters and tip radius (e.g., solid carbide round tools) that create different cutting surface geometries for the tools 172 and/or insert tools having different diameters and metal (e.g., carbide) inserts that create different cutting surface geometries for the tools 172. These different tools 172 can be arranged in tool families, where a tool family has one or more shared tool characteristics (e.g., a family 172A of solid carbide round tools having different diameters and tip radius that create the different cutting surface geometries, and a family 172B of insert tools having different diameters and metal inserts that create different cutting surface geometries). In addition, the CNC machine 170 can include other components and systems, such as rotatable platforms/attachments (e.g., for five-axis milling processes) and cleaning systems (e.g., sprayed water cleaning systems).

In any case, in addition to determining a finishing toolpath specification for the 3D model 132, the program(s) 116 generate a 3D model of a semi-finished structure on which the finishing toolpath(s) will operate. Using physics simulation models and algorithm(s), the program(s) 116 calculate relevant cutting forces to be applied when CNC machining different types of materials using milling tool geometry information and machining parameters (e.g., step-over and step-down in combination with part geometry) to generate 3D geometry of a semi-finished structure. This semi-finished structure is recommended so as to optimize stock allowance on the part during the finishing operation(s) so the workpiece (i.e., the semi-finished structure) has enough strength and rigidity to withstand the applied cutting forces during finishing by the CNC machine 170.

Figure 2:
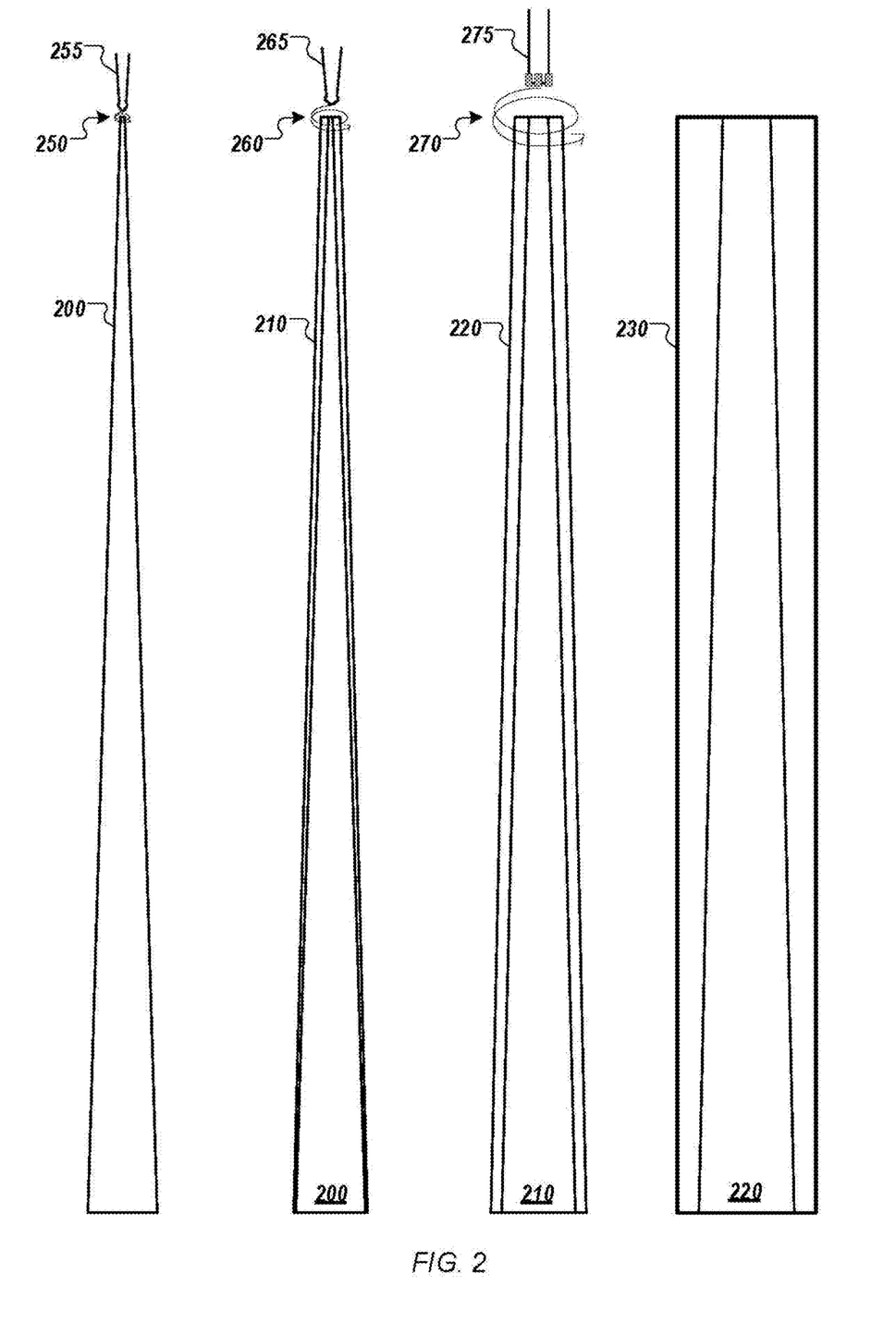
FIG. 2 shows a simplified example of a blade to be cut from a workpiece.

FIG. 2 shows a simplified example of a blade to be cut from a workpiece. For purposes of clarity in presentation, a model 200 of a tall thin structure is shown as a simple two dimensional representation of the blade, but as will be appreciated, the model 200 is representative of a 3D model of a blade, such as one of the blades in the turbine wheel of the 3D model 132. A finishing toolpath 250 is generated (e.g., by the program(s) 116 running on computer 110 and/or computer 150) for use in driving a finishing tool 255 (e.g., in CNC machine 170) to manufacture a physical blade corresponding to the 3D model 200.

In addition, a toolpath simulation of the finishing toolpath 250 can be performed (e.g., by the program(s) 116 running on computer 110 and/or computer 150) to generate a 3D model 210 of a semi-finished structure based on the forces to be applied by the finishing tool 255 during the finishing machining process. This can involve: (1) selecting an initial (nominal) semi-finished stock amount; (2) simulating the finishing toolpath to obtain forces on the workpiece using finite element analysis (FEA) and/or other physics simulation tools; (3) assessing deflections of the work piece; (4) if the deflections are too extreme, incrementally adding semi-finished stock to the workpiece; (5) if the deflections are minimal and safe, incrementally removing semi-finished stock from the workpiece; and (6) repeating steps 2-5 until the deflections are safe but the minimum possible stock is present.

Numerical optimization methods can be applied to this process. These can be zero-order methods (like genetic algorithms). They can also be gradient decent methods given that a shape function (or gradient) can be calculated. The gradient defines how the deflections change with the amount of semi-finished stock present. The benefit of the numerical optimization methods is that they are 'hands-off' and the computer can directly converge on and return the specific semi-finished shape. In any case, as shown in FIG. 2, the semi-finished structure model 210 can provide a stock allowance that varies continuously along a length of the part, i.e., the space between an outer boundary of the blade model 200 and an outer boundary of the semi-finished structure model 210 varies from a minimal stock allowance at the bottom of the blade (where the blade is thickest) to a larger stock allowance at the top of the blade (where the blade is thinnest). Thus, excess stock at the bottom of the blade is avoided, and inadequate stock at the top of the blade is also avoided.

Although this simple example only shows variation in the stock allowance from the bottom to the top of the blade, it will be appreciated that the variation in the stock allowance can extend in multiple different directions across a physical structure to be manufactured, depending upon the specific 3D geometry of the part, the material(s) from which the part is constructed, and the expected tooling forces to be applied in accordance with the finishing toolpath 250, the geometry of the finishing tool 255, and associated machining parameters. Thus, the resulting semi-finished structure model 210 represents a new surface that can provide an optimized stock allowance so the semi-finished structure will have enough strength and rigidity to withstand the cutting forces applied by the finishing tool 255 during CNC finishing, without requiring the user programming the manufacture of the part to specify a stock allowance amount. In addition to simplifying the user's experience for programming the manufacture of the part, this can result in improved surface finish and accuracy/tolerance for the manufactured part, along with the other potential advantages noted above.

Further, in some implementations, this simulation and optimization can be extended to the semi-finishing process in CNC machining. Thus, a semi-finishing toolpath 260 can be generated (e.g., by the program(s) 116 running on computer 110 and/or computer 150) for use in driving a semi-finishing tool 265 (e.g., in CNC machine 170) to manufacture the semi-finished structure corresponding to the semi-finished structure model 210. A toolpath simulation of the semi-finishing toolpath 260 can be performed (e.g., by the program(s) 116 running on computer 110 and/or computer 150) to generate a 3D model 220 of a roughed structure based on the forces to be applied by the semi-finishing tool 265 during the semi-finishing machining process. The toolpath simulation of the semi-finishing toolpath 260 can also involve the use of numerical optimization methods (e.g., zero-order methods and/or gradient decent methods) and/or the iterative simulating, assessing, and adding or removing of stock to the workpiece to ensure the deflections are safe while optimizing the stock amount, as described above the finishing toolpath 250 simulation.

As shown in FIG. 2, the roughed structure model 220 can likewise provide a stock allowance that varies continuously along a length of the part, i.e., the space between an outer boundary of the semi-finished structure model 210 and an outer boundary of the roughed structure model 220 varies from a small stock allowance at the bottom of the blade to a larger stock allowance at the top of the blade. Thus, the stock allowance can be optimized to withstand the cutting forces applied by the semi-finishing tool 265 during CNC semi-finishing, in accordance with the specific 3D geometry of the part, the material(s) from which the part is constructed, and the expected tooling forces to be applied in accordance with the semi-finishing toolpath 260, the geometry of the semi-finishing tool 265, and associated machining parameters, and without requiring the user programming the manufacture of the part to specify a stock allowance amount.

Moreover, in some implementations, this simulation and optimization can be further extended to the roughing process in CNC machining. Thus, a roughing toolpath 270 can be generated (e.g., by the program(s) 116 running on computer 110 and/or computer 150) for use in driving a roughing tool 275 (e.g., in CNC machine 170) to manufacture the semi-finished structure corresponding to the semi-finished structure model 210. A toolpath simulation of the roughing toolpath 270 can be performed (e.g., by the program(s) 116 running on computer 110 and/or computer 150) to generate a 3D model 230 of a blank structure based on the forces to be applied by the roughing tool 275 during the roughing machining process. The toolpath simulation of the roughing toolpath 270 can likewise involve the use of numerical optimization methods (e.g., zero-order methods and/or gradient decent methods) and/or the iterative simulating, assessing, adding or removing stock to the workpiece to ensure the deflections are safe while optimizing the stock amount, as described above the finishing toolpath 250 simulation.

Thus, returning to FIG. 1, in some implementations, the toolpath specification document 160 can include the semi-finishing toolpath 260 (or both the semi-finishing toolpath 260 and the roughing toolpath 270) in addition to the finishing toolpath 250, for use by the CNC machine 170 to drive cutting tools 172 to cut the physical object 180 (corresponding to the 3D model 132) from the workpiece. In practice, extending the simulation and optimization to the roughing process in CNC machining will typically not be needed, but can provide benefits in some cases. Moreover, the blank structure, the roughed structure, or the semi-finished structure can be manufactured using other manufacturing systems and techniques.

For example, the semi-finished structure can be manufactured using an additive manufacturing (AM) machine 174. In some implementations, the AM machine 174 employs granular techniques (e.g., Selective Laser Sintering (SLS) or Direct Metal Laser Sintering (DMLS)). For example, the AM machine 174 can include a laser 174A (e.g., a $CO_2$ laser) and a scanner 174B (e.g., galvanometers or a rotating polygonal mirror) to build the semi-finished structure in a powder bed 174C using powder delivery and piston mechanisms (not shown). In some implementations, the AM machine 174 employs extrusion techniques (e.g., Fused Filament Fabrication (FFF)). For example, the AM machine 174 can include a motion stage 174D (e.g., an XYZ Cartesian motion mechanism or a 3D delta printer motion mechanism) to build a mold 174E for use in (hot or cold) casting the semi-finished structure (note that FIG. 1 shows a simple representation of a pull-apart mold, but a sacrificial mold can also be used). Moreover, such manufacturing techniques can also be used to build the roughed structure.

Figure 3A:
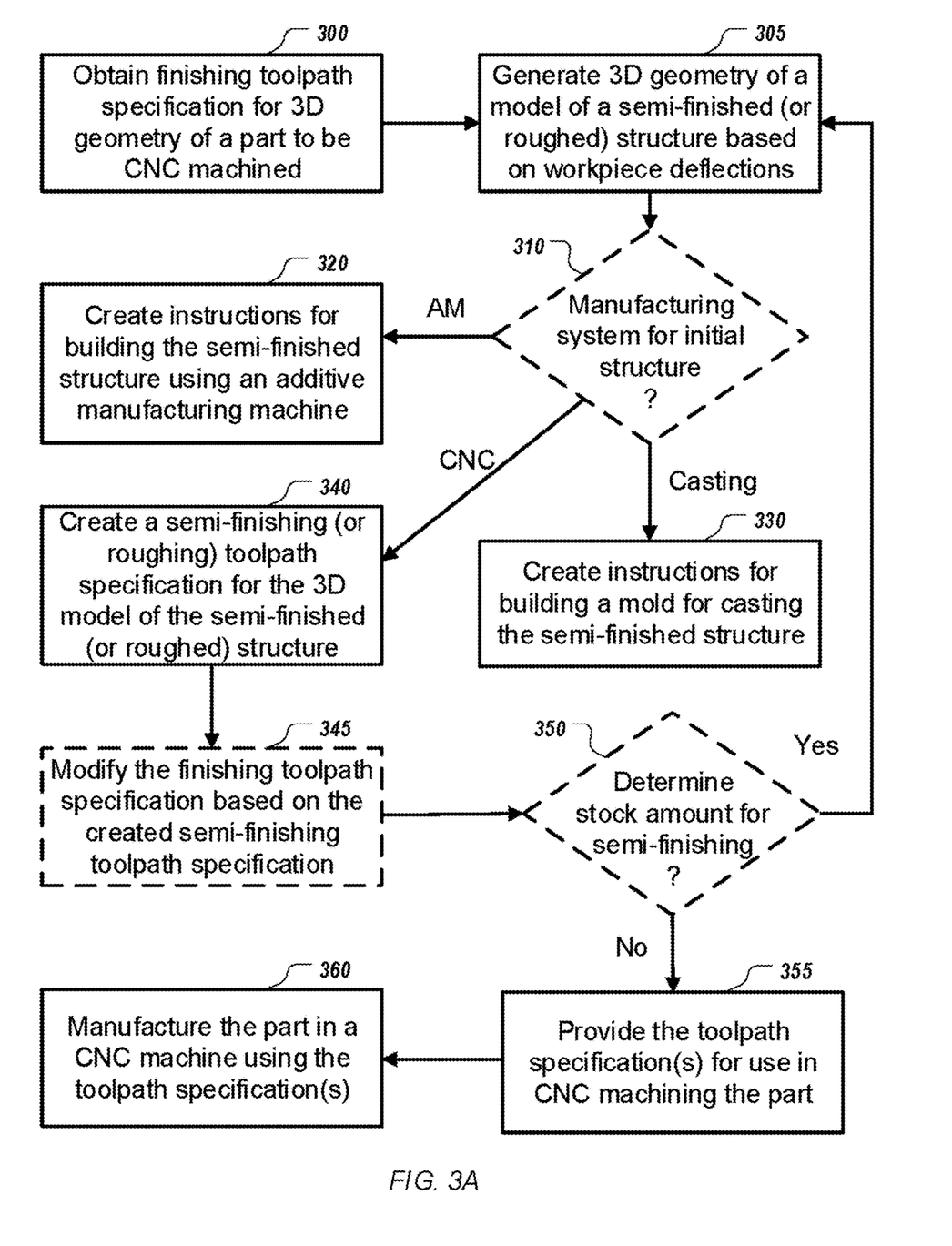
FIG. 3A shows an example of a process to determine a stock amount for a workpiece from which a physical structure will be manufactured using computer controlled machining systems and techniques.

FIG. 3A shows an example of a process to determine a stock amount for a workpiece from which a physical structure will be manufactured using computer controlled machining systems and techniques. A finishing toolpath specification is obtained 300 (e.g., by the program(s) 116 running on computer 110 and/or computer 150) for 3D geometry of a part to be machined by a computer-controlled manufacturing system (e.g., CNC machine 170) from a workpiece. In some cases, this involves generating the finishing toolpath specification, and in some cases, this involves receiving the finishing toolpath specification from another source. The 3D geometry of the part can be specified in a 3D model prepared by a user (e.g., user 190 using program 116 on computer 110), and CAD/CAM program algorithms can be used to calculate the finishing toolpath specification.

In some implementations, obtaining 300 the finishing toolpath specification involves creating the finishing toolpath specification based on a 3D model of the part and user input regarding one or more cutting conditions. The cutting conditions can include information regarding different cutting tools and cutting data for different cutting tools usable in a computer-controlled manufacturing system (e.g., CNC machine 170). For example, the information can include various machining parameters, such as tool size, shape, and number of flutes, depth of cut, feed rate, spindle speed, plunge rate, step-over and step-down, workpiece material (e.g., aluminum or steel) and tool material (e.g., carbide) specifications. In general, any suitable information (e.g., test data) that impacts how the workpiece will distort during cutting can be used to generate a force model (e.g., a force vector) of the force that the tool(s) exert on the workpiece for use in finishing toolpath simulation. In some implementations, some or all of the cutting conditions are obtained from another source (e.g., a provider of the computer-controlled manufacturing system).

Using such information, 3D geometry of a model of a semi-finished structure is generated 305 (e.g., by the program(s) 116 running on computer 110 and/or computer 150) in accordance with a computer simulation of deflections experienced by the workpiece as stock material is cut from the workpiece by the computer-controlled manufacturing system (e.g., CNC machine 170) using the finishing toolpath specification to form the part from the workpiece. CAD/CAM program algorithms can be used to simulate machining the part from the workpiece using one or more tools and determine the tooling forces that will be applied to the workpiece during the finishing operation. The simulation process can be parallelized (e.g., multiple programs 116) and/or be performed either on the local computer (e.g., computer 110 or CNC machine 170) or on remote computer(s) (e.g., one or more remote computer systems 150).

In some implementations, an optional manufacturing type check 310 is made. This check 310 involves determining how the semi-finished structure will be manufactured. If the semi-finished structure will be manufactured using AM, instructions are created 320 for building the semi-finished structure using an AM machine (e.g., instructions for SLS machine 174). If the semi-finished structure will be manufactured using casting, instructions are created 330 for building a mold for casting the semi-finished structure (e.g., instructions for FFF machine 174). If the semi-finished structure will be manufactured using CNC machining, instructions for driving a cutting tool (e.g., of CNC machine 170) are created, as described in further detail below. Moreover, in some implementations, more options or only two options are provided for manufacturing the semi-finished structure. In other implementations, the manufacturing technique to be used to manufacture the semi-finished structure is fixed, and no check 310 is made.

A semi-finishing toolpath specification is created 340 (e.g., by the program(s) 116 running on computer 110 and/or computer 150) for the 3D geometry of the model of the semi-finished structure. CAD/CAM program algorithms can be used to calculate the semi-finishing toolpath specification for use in manufacturing the semi-finished structure using the computer-controlled manufacturing system (e.g., CNC machine 170). Further, similar to creation of the finishing toolpath specification, the semi-finishing toolpath specification can be created based on the 3D model of the semi-finished structure and one or more cutting conditions (e.g., provided by a user, by another source, or a combination thereof). The cutting conditions can include information regarding different cutting tools and cutting data for different cutting tools usable in the computer-controlled manufacturing system (e.g., CNC machine 170). For example, the information can include various machining parameters, such as tool size, shape, and number of flutes, depth of cut, feed rate, spindle speed, plunge rate, step-over and step-down, workpiece material (e.g., aluminum or steel) and tool material (e.g., carbide) specifications.

In some implementations, the finishing toolpath specification is modified 345 (e.g., by the program(s) 116 running on computer 110 and/or computer 150) based on the created semi-finishing toolpath specification. Because the newly created 3D model of the semi-finished structure can create a substantially different stock allowance on the workpiece (based upon the forces mentioned above), this can impact the finishing toolpath specification, which was initially obtained before the new semi-finished structure was defined. Thus, changes to the finishing toolpath specification may be necessary to account for the new stock allowance(s). For example, the finishing feeds and speeds, depths of cut, plunge and ramp speeds can be calibrated for the finishing operation in light of the new stock allowance(s). In general, a check can be made to confirm (and adjust as needed) that the force applied by the finishing tool(s) (e.g., force per tooth) is acceptable in view of the cutting conditions. Including such a check and using the modified finishing toolpath specification (e.g., by the CNC machine 170) can ensure that the finishing pass will still work when used on the newly defined semi-finished structure.

In addition, as noted above, the simulation and optimization can be extended to the semi-finishing process in CNC machining. This extension can be hard coded into the program(s) or included as an option for the user. Thus, in some implementations, a check 350 is made to determine whether to generate a 3D model of a roughed structure as a new starting point for the semi-finishing operation. If so, a process similar to that described above is started, and 3D geometry of a model of the roughed structure is generated 305 (e.g., by the program(s) 116 running on computer 110 and/or computer 150) in accordance with a computer simulation of deflections experienced by the workpiece as stock material is cut from the workpiece by the computer-controlled manufacturing system (e.g., CNC machine 170) using the semi-finishing toolpath specification.

CAD/CAM program algorithms can be used to simulate machining the part from the workpiece using one or more tools and determine the tooling forces that will be applied to the workpiece during the semi-finishing operation. The simulation process can be parallelized (e.g., multiple programs 116) and/or be performed either on the local computer (e.g., computer 110 or CNC machine 170) or on remote computer(s) (e.g., one or more remote computer systems 150). Likewise, in some implementations, an optional manufacturing type check 310 is made to determine how the roughed structure will be manufactured (e.g., two or more options, such as AM, CNC, and/or casting, can be provided), or the manufacturing technique to be used to manufacture the roughed structure can be fixed.

Further, a roughing toolpath specification can be created 340 (e.g., by the program(s) 116 running on computer 110 and/or computer 150) for the 3D geometry of the model of the roughed structure. CAD/CAM program algorithms can be used to calculate the roughing toolpath specification for use in manufacturing the roughed structure using the computer-controlled manufacturing system (e.g., CNC machine 170). Further, similar to creation of the semi-finishing toolpath specification, the roughing toolpath specification can be created based on the 3D model of the roughed structure and one or more cutting conditions (e.g., provided by a user, by another source, or a combination thereof). The cutting conditions can include information regarding different cutting tools and cutting data for different cutting tools usable in the computer-controlled manufacturing system (e.g., CNC machine 170). For example, the information can include various machining parameters, such as tool size, shape, and number of flutes, depth of cut, feed rate, spindle speed, plunge rate, step-over and step-down, workpiece material (e.g., aluminum or steel) and tool material (e.g., carbide) specifications. Moreover, similar to the above described process, in some implementations, the semi-finishing toolpath specification is modified 345 (e.g., by the program(s) 116 running on computer 110 and/or computer 150) based on the created roughing toolpath specification.

Once the new structure(s) have been modeled and toolpath specification(s) have been defined, the semi-finishing toolpath specification (and potentially the roughing toolpath specification) are provided 355 for use in machining the part by the computer-controlled manufacturing system (e.g., CNC machine 170) by cutting away portions of the stock material in a series of two or more operations. Note that a roughing operation (the process of removing material to approach the net shape of the part and minimize the amount of material to be removed during later semi-finishing and/or finishing phases) will not be required in all cases, but may be required in some cases, depending on the nature of the part and the starting workpiece. Thus, in some implementations, the roughing toolpath specification created at 340 is provided 355 for use in machining the part by the computer-controlled manufacturing system (e.g., CNC machine 170) by cutting away a portion of the stock material using the roughing toolpath specification to form the roughed structure from the workpiece before performing the semi-finishing operation on the roughed structure.

In some implementations, the semi-finishing toolpath specification created at 340 is provided 355 for use in machining the part by the computer-controlled manufacturing system (e.g., CNC machine 170) by cutting away a portion of the stock material using the semi-finishing toolpath specification to form the semi-finished structure from the workpiece. Further, the finishing toolpath specification is provided 355 for use in machining the part by the computer-controlled manufacturing system (e.g., CNC machine 170) by cutting away a portion of the stock material using the finishing toolpath specification. As noted above, the roughing operation is followed by the semi-finishing operation, which is followed by the finishing operation. Moreover, in some implementations, subject to the nature of the part, the tool(s) to be used and the materials of the part and the tool(s), the systems and techniques described herein can be applied to form a roughed structure, without an intermediate semi-finished structure, and the machining can go from a roughing operation straight to a finishing operation. In any case, the part can be manufactured 360 in a CNC machine using the toolpath specification(s) created using the systems and techniques described in this specification.

Figure 3B:
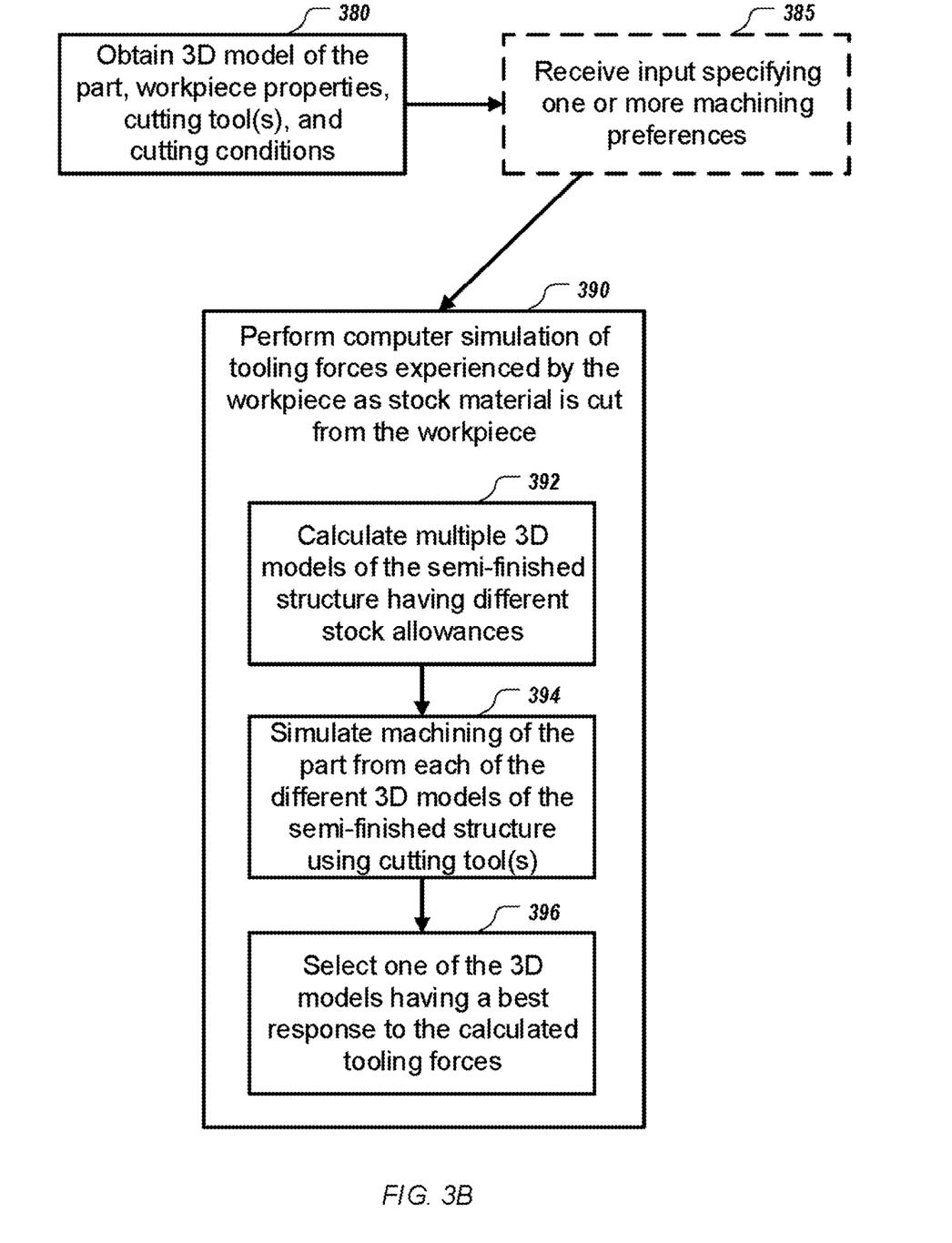
FIG. 3B shows an example of a process to generate a three dimensional model of a semi-finished structure from which a part will be manufactured using computer controlled machining systems and techniques.

FIG. 3B shows an example of a process to generate a three dimensional model of a semi-finished structure from which a part will be manufactured using computer controlled machining systems and techniques. Information for use in the simulation is obtained 380 (e.g., by the program(s) 116 running on computer 110 and/or computer 150). This information can be obtained from various sources (e.g., a user, local storage, a third party database, or a combination thereof) and can involve retrieving the information, receiving the information, or both. The information can include a computer model of the three dimensional geometry of the part, first information regarding material properties of the workpiece, second information regarding one or more cutting tools to be used by the computer-controlled manufacturing system (e.g., CNC machine 170), and cutting conditions of the finishing toolpath specification. The cutting conditions can include a maximum depth of cut and other machining parameters, such as tool size, shape, and number of flutes, depth of cut, feed rate, spindle speed, plunge rate, step-over and step-down, workpiece material (e.g., aluminum or steel) and tool material (e.g., carbide) specifications. In general, any suitable information (e.g., test data) that impacts how the workpiece may distort during cutting can be used to generate a force model (e.g., a force vector) of the force that the tool(s) exert on the workpiece for use in finishing toolpath simulation, and the system can quantify the effect that each low-level parameter has on the force vector that the tool applies to the workpiece.

In some implementations, input is received 385 (e.g., by the program(s) 116 running on computer 110 and/or computer 150) specifying a machining preference among manufacturing speed, surface finish quality, maximizing tool life, and minimizing vibration. In some cases, a single machining preference is selected. In some cases, more than one machining preference is selected, and relative rankings (e.g., weightings) can be specified for each. In any case, the 3D model generation can take account of the machining preference(s).

Computer simulation is then performed 390 to assess the tooling forces experienced by the workpiece as stock material is cut from the workpiece by the computer-controlled manufacturing system using the finishing toolpath specification and various depths of cut that are equal to or less than the maximum depth of cut. Note that the same approach can also be used with the semi-finishing toolpath specification to create a 3D model of a roughed structure, as described above. Various physics simulation models and algorithm(s) can be employed, as will be appreciated. In some implementations, the simulation 390 involves the use of numerical optimization methods (e.g., zero-order methods and/or gradient decent methods) and/or the iterative simulating, assessing, adding or removing stock to the workpiece to ensure the deflections are safe while optimizing the stock amount, as described above in connection with FIG. 2.

In some implementations, performing 390 the computer simulation includes the following. Multiple 3D models of the semi-finished structure can be calculated 392 (e.g., by the program(s) 116 running on computer 110 and/or computer 150), where each of the multiple 3D models has a different stock allowance. Calculating 392 the multiple 3D models can include calculating, for each model, a stock allowance that varies continuously along a length of the part, as described above. Machining of the part from each of the multiple 3D models can be simulated 394 (e.g., by the program(s) 116 running on computer 110 and/or computer 150) using the one or more cutting tools of the computer-controlled manufacturing system. Then, one of the multiple 3D models having a best response to the tooling forces calculated during the simulating can be selected 396 (e.g., by the program(s) 116 running on computer 110 and/or computer 150) either automatically or based on user input.

In some implementations, initial semi-finished structure models are determined by taking the final part geometry and subjecting it to nominal toolpath strategy forces. The deflections and stresses on the part can be analyzed to assess whether the toolpath strategy is acceptable. Depending on user requirements, this can return an ok/not-ok assessment, or it can look to optimize, in which case the program can use a mixture of gradient decent methods and zero-order methods to vary the toolpath strategy and assess suitable perturbations of the initial semi-finished structure model. If the result is not ok, the same optimization approach can be used to determine an acceptable solution.

Figure 4:
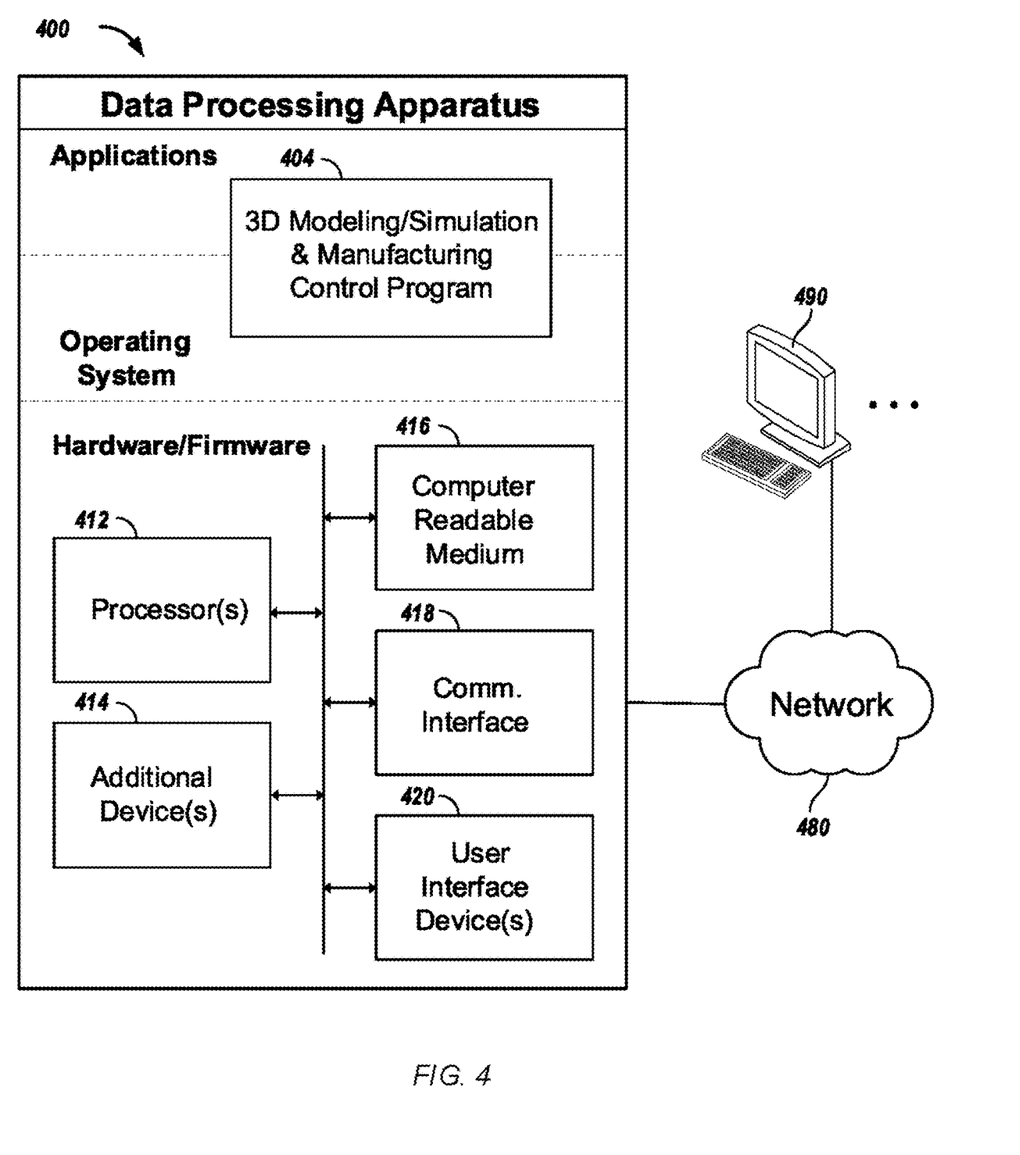
FIG. 4 is a schematic diagram of a data processing system usable to implement the described systems and techniques.

FIG. 4 is a schematic diagram of a data processing system including a data processing apparatus 400, which can be programmed as a client or as a server. The data processing apparatus 400 is connected with one or more computers 490 through a network 480. While only one computer is shown in FIG. 4 as the data processing apparatus 400, multiple computers can be used. The data processing apparatus 400 includes various software modules, which can be distributed between an applications layer and an operating system. These can include executable and/or interpretable software programs or libraries, including tools and services of a 3D modeling/simulation and manufacturing control program 404 that implements the systems and techniques described above. The number of software modules used can vary from one implementation to another. Moreover, the software modules can be distributed on one or more data processing apparatus connected by one or more computer networks or other suitable communication networks.

The data processing apparatus 400 also includes hardware or firmware devices including one or more processors 412, one or more additional devices 414, a computer readable medium 416, a communication interface 418, and one or more user interface devices 420. Each processor 412 is capable of processing instructions for execution within the data processing apparatus 400. In some implementations, the processor 412 is a single or multi-threaded processor. Each processor 412 is capable of processing instructions stored on the computer readable medium 416 or on a storage device such as one of the additional devices 414. The data processing apparatus 400 uses the communication interface 418 to communicate with one or more computers 490, for example, over the network 480. Examples of user interface devices 420 include a display, a camera, a speaker, a microphone, a tactile feedback device, a keyboard, a mouse, and VR and/or AR equipment. The data processing apparatus 400 can store instructions that implement operations associated with the program(s) described above, for example, on the computer readable medium 416 or one or more additional devices 414, for example, one or more of a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims.

What is claimed is:
1. A computer-implemented method comprising:
obtaining, in a computer-aided design or manufacturing program, a finishing toolpath specification for three dimensional geometry of a three-dimensional model of a part to be machined by a computer-controlled manufacturing system from a workpiece;
generating three dimensional geometry of a model of a semi-finished structure on which a finishing operation according to the finishing toolpath specification is to be performed, wherein the three dimensional geometry of the model of the semi-finished structure has a stock allowance determined in accordance with a computer simulation of deflections experienced by the workpiece as stock material is cut during the finishing operation from the workpiece by the computer-controlled manufacturing system using the finishing toolpath specification to form the part from the workpiece;
creating a semi-finishing toolpath specification for the three dimensional geometry of the model of the semi-finished structure; and
providing the semi-finishing toolpath specification for use in machining the part by the computer-controlled manufacturing system by cutting away a first portion of the stock material using the semi-finishing toolpath specification to form the semi-finished structure from the workpiece, followed by performing the finishing operation of the semi-finished structure by cutting away a second portion of the stock material to form the part from the workpiece.

2. The computer-implemented method of claim 1, wherein obtaining the finishing toolpath specification comprises creating the finishing toolpath specification based on the three dimensional model of the part and user input regarding one or more cutting conditions.

3. The computer-implemented method of claim 1, comprising modifying the finishing toolpath specification based on the created semi-finishing toolpath specification, wherein the finishing operation uses the modified finishing toolpath specification.

4. The computer-implemented method of claim 1, comprising:
generating three dimensional geometry of a model of a roughed structure in accordance with a computer simulation of deflections experienced by the workpiece as stock material is cut from the workpiece by the computer-controlled manufacturing system using the semi-finishing toolpath specification;

creating a roughing toolpath specification for the three dimensional geometry of the model of the roughed structure; and providing the roughing toolpath specification for use in machining the part by the computer-controlled manufacturing system by cutting away a third portion of the stock material using the roughing toolpath specification to form the roughed structure from the workpiece before performing the semi-finishing operation on the roughed structure.

5. The computer-implemented method of claim 1, comprising:

obtaining (i) the three dimensional model of the part, (ii) first information regarding material properties of the workpiece, (iii) second information regarding one or more cutting tools to be used by the computer-controlled manufacturing system, and (iv) cutting conditions of the finishing toolpath specification, wherein the cutting conditions include a maximum depth of cut; and performing the computer simulation of tooling forces experienced by the workpiece as stock material is cut from the workpiece by the computer-controlled manufacturing system using the finishing toolpath specification and various depths of cut that are equal to or less than the maximum depth of cut.

6. The computer-implemented method of claim 5, wherein performing the computer simulation comprises:

calculating multiple three dimensional models of the semi-finished structure, wherein each of the multiple three dimensional models has a different stock allowance;

simulating machining of the part from each of the multiple three dimensional models using the one or more cutting tools of the computer-controlled manufacturing system; and selecting one of the multiple three dimensional models having a best response to the deflection forces calculated during the simulating.

7. The computer-implemented method of claim 6, wherein performing the computer simulation comprises:

selecting an initial semi-finished stock amount to indicate a first one of the multiple three dimensional models;

performing numerical toolpath simulation using finite element analysis to simulate the machining of the part;

assessing the deflections experienced by the workpiece in accordance with the finite element analysis of the numerical toolpath simulation;

incrementally adding or removing semi-finished stock amount, based on the assessed deflections, to indicate a next one of the multiple three dimensional models; and repeating the performing the numerical toolpath simulation, the assessing the deflections, and the incrementally adding or removing the semi-finished stock amount to optimize the semi-finished stock amount.

8. The computer-implemented method of claim 6, comprising receiving input specifying a machining preference among (i) manufacturing speed, (ii) surface finish quality, (iii) maximizing tool life, and (iv) minimizing vibration, wherein the calculating, simulating and selecting is performed in accordance with the machining preference.

9. The computer-implemented method of claim 6, wherein calculating the multiple three dimensional models comprises calculating, for each model, a stock allowance that varies continuously along a length of the part.

10. The computer-implemented method of claim 1, wherein the computer-controlled manufacturing system comprises one or more computer processing apparatus including at least one non-transitory computer-readable medium encoding the computer aided design or manufacturing program.

11. A system comprising:

a data processing apparatus including at least one hardware processor; and a non-transitory computer-readable medium encoding instructions of a computer-aided design or manufacturing program, the instructions being configured to cause the data processing apparatus to obtain a finishing toolpath specification for three dimensional geometry of a three-dimensional model of a part to be machined by a computer-controlled manufacturing system from a workpiece;

generate three dimensional geometry of a model of a semi-finished structure on which a finishing operation according to the finishing toolpath specification is to be performed, wherein the three dimensional geometry of the model of the semi-finished structure has a stock allowance determined in accordance with a computer simulation of deflections experienced by the workpiece as stock material is cut during the finishing operation from the workpiece by the computer-controlled manufacturing system using the finishing toolpath specification to form the part from the workpiece;

create a semi-finishing toolpath specification for the three dimensional geometry of the model of the semi-finished structure; and provide the semi-finishing toolpath specification for use in machining the part by the computer-controlled manufacturing system by cutting away a first portion of the stock material using the semi-finishing toolpath specification to form the semi-finished structure from the workpiece, followed by performing the finishing operation of the semi-finished structure by cutting away a second portion of the stock material to form the part from the workpiece.

12. The system of claim 11, wherein the non-transitory computer-readable medium encodes the instructions configured to cause the data processing apparatus to modify the finishing toolpath specification based on the created semi-finishing toolpath specification, wherein the finishing operation uses the modified finishing toolpath specification.

13. The system of claim 11, wherein the non-transitory computer-readable medium encodes the instructions configured to cause the data processing apparatus to:

generate three dimensional geometry of a model of a roughed structure in accordance with a computer simulation of deflections experienced by the workpiece as stock material is cut from the workpiece by the computer-controlled manufacturing system using the semi-finishing toolpath specification;

create a roughing toolpath specification for the three dimensional geometry of the model of the roughed structure; and provide the roughing toolpath specification for use in machining the part by the computer-controlled manufacturing system by cutting away a third portion of the stock material using the roughing toolpath specification to form the roughed structure from the workpiece before performing the semi-finishing operation on the roughed structure.

14. The system of claim 11, wherein the non-transitory computer-readable medium encodes the instructions configured to cause the data processing apparatus to:
obtain (i) the three dimensional model of the part, (ii) first information regarding material properties of the workpiece, (iii) second information regarding one or more cutting tools to be used by the computer-controlled manufacturing system, and (iv) cutting conditions of the finishing toolpath specification, wherein the cutting conditions include a maximum depth of cut; and
perform the computer simulation of tooling forces experienced by the workpiece as stock material is cut from the workpiece by the computer-controlled manufacturing system using the finishing toolpath specification and various depths of cut that are equal to or less than the maximum depth of cut.

15. The system of claim 14, wherein the non-transitory computer-readable medium encodes the instructions configured to cause the data processing apparatus to perform the computer simulation by:
calculating multiple three dimensional models of the semi-finished structure, wherein each of the multiple three dimensional models has a different stock allowance;
simulating machining of the part from each of the multiple three dimensional models using the one or more cutting tools of the computer-controlled manufacturing system; and
selecting one of the multiple three dimensional models having a best response to the deflection forces calculated during the simulating.

16. The system of claim 15, wherein the non-transitory computer-readable medium encodes the instructions configured to cause the data processing apparatus to receive input specifying a machining preference among (i) manufacturing speed, (ii) surface finish quality, (iii) maximizing tool life, and (iv) minimizing vibration, wherein the calculating, simulating and selecting is performed in accordance with the machining preference.

17. The system of claim 11, comprising the computer-controlled manufacturing system.

18. A non-transitory computer-readable medium encoding instructions operable to cause data processing apparatus to perform operations comprising:
obtaining, in a computer-aided design or manufacturing program, a finishing toolpath specification for three dimensional geometry of a three-dimensional model of a part to be machined by a computer-controlled manufacturing system from a workpiece;
generating three dimensional geometry of a model of a semi-finished structure on which a finishing operation according to the finishing toolpath specification is to be performed, wherein the three dimensional geometry of the model of the semi-finished structure has a stock allowance determined in accordance with a computer simulation of deflections experienced by the workpiece as stock material is cut during the finishing operation from the workpiece by the computer-controlled manufacturing system using the finishing toolpath specification to form the part from the workpiece;
creating a semi-finishing toolpath specification for the three dimensional geometry of the model of the semi-finished structure; and
providing the semi-finishing toolpath specification for use in machining the part by the computer-controlled manufacturing system by cutting away a first portion of the stock material using the semi-finishing toolpath specification to form the semi-finished structure from the workpiece, followed by performing the finishing operation of the semi-finished structure by cutting away a second portion of the stock material to form the part from the workpiece.

19. The non-transitory computer-readable medium of claim 18, wherein obtaining the finishing toolpath specification comprises creating the finishing toolpath specification based on the three dimensional model of the part and user input regarding one or more cutting conditions.

20. The non-transitory computer-readable medium of claim 18, wherein the operations comprise modifying the finishing toolpath specification based on the created semi-finishing toolpath specification, wherein the finishing operation uses the modified finishing toolpath specification.

21. The non-transitory computer-readable medium of claim 18, wherein the operations comprise:
obtaining (i) the three dimensional model of the part, (ii) first information regarding material properties of the workpiece, (iii) second information regarding one or more cutting tools to be used by the computer-controlled manufacturing system, and (iv) cutting conditions of the finishing toolpath specification, wherein the cutting conditions include a maximum depth of cut; and
performing the computer simulation of tooling forces experienced by the workpiece as stock material is cut from the workpiece by the computer-controlled manufacturing system using the finishing toolpath specification and various depths of cut that are equal to or less than the maximum depth of cut.

* * * * *